United States Patent
Sperschneider et al.

(10) Patent No.: US 7,526,432 B2
(45) Date of Patent: *Apr. 28, 2009

(54) APPARATUS AND METHOD FOR PRODUCING A DATA STREAM AND APPARATUS AND METHOD FOR READING A DATA STREAM

(75) Inventors: Ralph Sperschneider, Erlangen (DE); Martin Dietz, Nuremberg (DE); Daniel Homm, Erlangen (DE); Reinhold Böhm, Nuremberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/018,136

(22) Filed: Jan. 22, 2008

(65) Prior Publication Data

US 2008/0111719 A1    May 15, 2008

Related U.S. Application Data

(62) Division of application No. 09/913,708, filed on Sep. 24, 2001, now Pat. No. 7,433,825.

(51) Int. Cl.
*G01L 21/04* (2006.01)

(52) U.S. Cl. .............. 704/503; 704/504; 704/228; 375/240.23

(58) Field of Classification Search ......... 704/500–504, 704/228; 348/384, 366; 375/240.23
See application file for complete search history.

(56) References Cited

U.S. PATENT DOCUMENTS

| | | | |
|---|---|---|---|
| 5,835,144 A | 11/1998 | Matsumura et al. | |
| 5,852,469 A * | 12/1998 | Nagai et al. ............ | 375/240.23 |
| 2001/0053184 A1 | 12/2001 | Chujoh et al. | |

FOREIGN PATENT DOCUMENTS

| AU | 754877 | 7/2000 |
|---|---|---|
| DE | 3702490 A | 8/1988 |
| DE | 69126565 T | 10/1991 |
| DE | 19747119 A | 4/1999 |
| EP | 0612156 A | 8/1997 |
| JP | 4504936 | 8/1992 |

* cited by examiner

*Primary Examiner*—Huyen X. Vo
(74) *Attorney, Agent, or Firm*—Michael A. Glenn; Glenn Patent Group

(57) ABSTRACT

An entropy encoder includes an apparatus for producing a data stream which comprises two reference points, of code words of variable lengths, the apparatus comprising a first device for writing at least a part of a code word into the data stream in a first direction of writing, starting from a first reference point, and a second device for writing at least a part of a code word into the data stream in a second direction of writing, which is opposite to the first direction of writing, starting from the other reference point. In particular, when a raster having a plurality of segments is used to write the code words of variable lengths into the data stream, the number of the code words which can be written starting at raster points is doubled, in the best case, such that the data stream of code words of variable lengths is robust toward a propagation of sequence errors.

5 Claims, 6 Drawing Sheets

CODE WORDS OF VARIABLE LENGTHS a) WRITING THE CODE WORDS OF THE 1st SET b) WRITING THE CODE WORDS OF THE 2nd SET

ATTEMPT 1 (7 IN 1, 8 IN 2, 9 IN 3, 10 IN 4, 11 IN 5, 12 IN 6): STORING 7b

ATTEMPT 2 (7 IN 2):

c) WRITING THE CODE WORDS OF THE 3$^{rd}$ SET

ATTEMPT 1 (13 IN 1, 14 IN 2, 15 IN 3): STORING 13, 14, 15b

ATTEMPT 2 (13 IN 2, 14 IN 3, 15 IN 4): STORING 13, 14

ATTEMPT 3 (13 IN 3, 14 IN 4): STORING 13, 14
ATTEMPT 4 (13 IN 4, 14 IN 5): STORING 13, 14b

ATTEMPT 5 (13 IN 5, 14 IN 6): STORING 13

ATTEMPT 6 (13 IN 6)

ERROR- ROBUST DATA STREAM

CODE WORDS OF VARIABLE LENGTHS

ERROR- ROBUST DATA STREAM (FIG. 3)

a) EXTRACTING THE CODE WORDS OF THE 1st SET b) EXTRACTING THE CODE WORDS OF THE 2nd SET
ATTEMPT 1 (SEARCHING 7 IN 1, 8 IN 2, 9 IN 3, 10 IN 4, 11 IN 5, 12 IN 6)
STORING 7a

ATTEMPT 2 (SEARCHING 7 IN 2)

c) EXTRACTING THE CODE WORDS OF THE 3rd SET

ATTEMPT 1 (SEARCHING 13 IN 1, 14 IN 2, 15 IN 3)

STORING 15a

ATTEMPT 2 (SEARCHING 13 IN 2, 14 IN 3, 15 IN 4)

ATTEMPT 3 (SEARCHING 13 IN 3, 14 IN 4)
ATTEMPT 4 (SEARCHING 13 IN 4, 14 IN 5)

STORING 14a

ATTEMPT 5 (SEARCHING 13 IN 5, 14 IN 6)

ATTEMPT 6 (SEARCHING 13 IN 6)

PRIORITY CODE WORD

NON- PRIORITY CODE WORD

APPARATUS AND METHOD FOR PRODUCING A DATA STREAM AND APPARATUS AND METHOD FOR READING A DATA STREAM

CROSS-REFERENCE TO RELATED APPLICATION

This application is a divisional of U.S. patent application Ser. No. 09/913,708 filed on Sep. 24, 2001 now U.S. Pat. No. 7,433,825, which is incorporated herein by this reference thereto.

FIELD OF THE INVENTION

The present invention relates to encoding with code words of variable lengths and, in particular, to producing and reading data streams with code words of variable lengths, which are robust with regard to errors in transmission.

BACKGROUND OF THE INVENTION AND PRIOR ART

Modern audio encoding or decoding methods which work by the MPEG layer 3 standard, for example, are capable of compressing the data rate of audio signals, e.g. by a factor 12, without noticeably degrading the quality thereof. In order to achieve such a high data rate reduction, an audio signal is sampled, whereby a sequence of discrete-time samples is obtained. As is known in the art, the sequence of discrete-time samples is windowed in order to obtain windowed blocks of time samples. A block of time-windowed samples is then transformed to the frequency range by means of a filter bank, a modified discrete cosine transform (MDCT) or other suitable device, in order to obtain spectral values which, as a whole, represent the audio signal, i.e. the time section determined by the block of discrete-time samples, in the frequency range. Usually, time blocks which overlap at 50% are produced and transformed to the frequency range by means of a MDCT whereby, due to the specific properties of the MDCT, 1024 discrete-time samples, for example, always lead to 1024 spectral values.

It is known that the receptivity of the human ear depends on the momentary spectrum of the audio signal itself. This dependency is covered in the so-called psycho-acoustic model by means of which it has been possible for quite some time to calculate masking thresholds depending on the momentary spectrum. Masking means that a specific tone or a spectral component is hidden in case an adjacent spectral range, for example, has relatively high energy. This fact of masking is utilized in order to quantize as closely as possible the spectral values present after the transformation. The aim is therefore to avoid audible interferences in the re-decoded audio signal on the one hand and to use as few bits as possible on the other hand in order to encode or, in this case, to quantize the audio signal. The interferences introduced by quantization, i.e. quantization noise, are intended to be below the masking threshold and, therefore, to be inaudible. In accordance with known methods, a classification of the spectral values in so-called scale factor bands is carried out, which should correspond to the critical bands, i.e. frequency groups, of the human ear. Spectral values in a scale factor group are multiplied by a scale factor in order to carry out overall scaling of spectral values of a scale factor band. The scale factor bands scaled by the scale factor are then quantized, whereupon quantized spectral values are produced. It is understood that grouping in scale factor bands is not critical. However, it is used in the MPEG layer 3 standards or in the MPEG 2 AAC standard (AAC=advanced audio coding).

A very essential aspect of data reduction lies in entropy encoding of the quantized spectral values, which follows quantizing. Huffman encoding is usually used for entropy encoding. A Huffman coding is understood to mean a coding with a variable length, i.e. the length of the code word for a value to be encoded is dependent on the probability of occurrence thereof. Logically, the most probable character is assigned the shortest code, i.e. the shortest code word, so that very good redundancy reduction can be achieved by means of Huffman encoding. An example for a generally-known coding with a general length is the Morse code.

In the field of audio encoding, Huffman codes are used for encoding the quantized spectral values. A modern audio encoder, which works, for example, in accordance with the MPEG 2 AAC standard, uses different Huffman code tables for encoding the quantized spectral values, which Huffman code tables are assigned to the spectrum by certain criteria on a section-by-section basis. In this process, 2 or 4 spectral values are always encoded together in one code word.

One difference between the method in accordance with MPEG 2 AAC and the method in accordance with MPEG layer 3 is that different scale factor bands, i.e. different spectral values, are grouped into any number of spectral sections. With AAC, one spectral section includes at least four spectral values, but preferably more than four spectral values. The entire frequency range of the spectral values is therefore divided up into adjacent sections, with one section representing one frequency band such that all sections together cover the entire frequency range, which is superimposed by the spectral values after the transformation thereof.

As in the MPEG layer 3 method, one section is assigned to a so-called "Huffman table" from a plurality of such tables in order to achieve a maximum redundancy reduction. In the bit stream of the AAC method, which usually comprises 1024 spectral values, are now the Huffman code words for the spectral values in an ascending order of frequencies. The information on the table used in each frequency section is transferred in the side information. This situation is shown in FIG. 6.

FIG. 6 shows the exemplary case where the bit stream includes 10 Huffman code words. In case one code word is always formed from one spectral value, 10 spectral values may be encoded here. However, usually 2 or 4 spectral values are always jointly encoded by one code word, which is why FIG. 6 shows a part of the encoded bit stream which includes 20 or 40 spectral values. In the case where each Huffman code word includes 2 spectral values, the code word designated by No. 1 represents the first two spectral values, with the length of code word No. 1 being relatively short, which means that the values of the first two spectral values, i.e. of the two smallest frequency coefficients, occur relatively frequently. The code word bearing the No. 2, however, has a relatively long length, which means that the amounts of the $3^{rd}$ and $4^{th}$ spectral coefficients in the encoded audio signal are relatively rare, which is why they are encoded with a relatively large amount of bits. Further, it is apparent from FIG. 6 that the code words with the numbers 3, 4 and 5, which represent the spectral coefficients 5 and 6 or 7 and 8 or 9 and 10, also occur relatively frequently, since the length of the individual code words is relatively small. The same applies to the code words bearing the numbers 6 to 10.

As has already been mentioned, it is clearly apparent from FIG. 6 that the Huffman code words for the encoded spectral values are arranged in the bit stream in a linearly ascending manner with regard to the frequency in case a bit stream which is produced by a known encoding apparatus is considered.

One major drawback with regard to Huffman codes, in the case of faulty channels, is error propagation. It may be assumed, for example, that code word No. 2 in FIG. 6 is interfered with. There is a certain, not low, probability that the length of this wrong code word No. 2 is also modified. It therefore is different from the correct length. In case, in the example of FIG. 6, code word No. 2 has been modified in its length due to an interference, it is no longer possible for an encoder to determine the starts of the code words 3 to 10, i.e. of almost the entire audio signal represented. This means that all other code words following the code word which has been interfered with can no longer be correctly encoded, since it is not known where these code words start, and since an incorrect starting point was selected due to the error.

As a solution to the problem of error propagation, European Patent No. 0 612 156 proposes that a part of the code words of variable lengths be arranged in a raster and that the remaining code words be distributed in the remaining gaps, so that the start of a code word which is arranged at a raster point can be more easily found without full decoding or in the case of an incorrect transmission.

It is true that the known method provides some remedy for error propagation by means of rearranging the code words. For some code words, a fixed location in the bit stream is agreed upon, whereas the remaining gaps are available for the remaining code words. This does not cost any additional bits, but prevents, in the case of an error, error propagation among the rearranged code words.

German Patent Application 19 747 119.6-31, which was published after the filing date of the present application, proposes that not just any code words be located at raster points, but that code words which are significant from a psychoacoustic point of view, i.e. code words for spectral values which make a significant contribution to the audio signal, be located at raster points. A data stream with code words of variable lengths, such as is produced by such an encoder, is shown in FIG. 5. As in FIG. 6, the data stream also includes 10 code words, with the priority code words being shaded. The first priority code word is located such as to start at a first rater point 100, the second priority code word is located such as to start at a second raster point 101, the third priority code word is located such as to start at a third raster point 102, the fourth priority code word is located such as to start at a fourth raster point 103 and the fifth priority code word is located such as to start at a fifth raster point 104. A first segment 105 is defined by the raster points 100 and 101. Similarly, a second 106, a third 107, a fourth 108 and a final segment 109 are defined. It is shown in FIG. 5 that the first two segments 105 and 106 have a different length from the two segments 107 and 108 and yet a different length from the final segment 109. Non-priority code words 6, 7, 8, 9 and 10 are then entered in the data stream following the priority code words such that the latter is filled up, so to speak. As is shown in FIG. 5, in the post-published method, the non-priority code words are consecutively inserted in the raster after the priority code words have been written. Specifically, the non-priority code word No. 6 is entered following the non-priority code word 1. The space still remaining in the segment 105 is filled up with the following non-priority code word 7, with the remainder of the non-priority code word 7, i.e. 7*b*, being written in the next free space, i.e. in the segment 107, directly following the priority code word 3. The same procedure is followed for the non-priority code words 8 to 10.

The advantage of the post-published method illustrated in FIG. 5 is that the priority code words 1 to 5 are protected against error propagation, since their starting points coincide with raster points and are therefore known.

In case, for example, the priority code word 2 has been damaged in transmission, it is very likely in the prior art shown in FIG. 6 that a decoder will not be able to decode any of the remaining code words 3 to 10 correctly. In the method shown in FIG. 5, however, the next code word, i.e. priority code word 3, starts at the raster point 102 such that the decoder will, at any rate, find the correct start of code word 3. Therefore, in the method shown in FIG. 5, no sequence error whatsoever will occur, and only priority code word No. 2 will be damaged. Consequently, this method provides effective protection for priority code words which are located at raster points.

However, there is no effective protection for non-priority code words. Referring to FIG. 5, damaging the non-priority code word No. 6 such that the decoder assumes, as an incorrect code word No. 6, a code word which is one bit shorter, will result in the fact that it is also no longer possible to correctly decode code word No. 7, since the last bit of the correct code word No. 6 is interpreted as being the start of the next code word No. 7. Therefore, an error in code word No. 6 will lead to the fact that, at a very high probability, it will no longer be possible, due to a sequence error, to correctly decode any code words following it even in case they have not been adversely affected by a transmission error.

DE 691 26 565 T2 relates to a method for transmitting codes of variable lengths. By this method, a data stream is produced in which, starting from the start of the data stream, code words of variable lengths are written in a first direction up to a certain point in the data stream. However, in order to increase error robustness, not the entire data stream is written in one direction, but merely up to the predetermined point. From the end of the data stream, the remainder of the code words of variable lengths is then written in an opposite direction of writing up to the predetermined point, so that a data stream results whose first half comprises code words which are written in the forward direction and whose second half comprises code words which are written in the backward direction.

U.S. Pat. No. 5,852,469 relates to encoding and decoding systems for code words with variable lengths and code words with specified lengths. It is provided, for code words with specified lengths, to provide synchronous positions in the data stream whose distance is equal to the length of the code words of specified lengths. The code words are then entered into the data stream such that they all start at a synchronous position. For code words of variable lengths, a data stream with a start and an end, however without synchronous positions, is provided in order to enter code words of variable lengths in the forward direction, starting from the start of the data stream up to a certain position behind the center of the data stream. Starting from the end of the data stream up to the predetermined position in the center, code words of variable lengths are then entered in the opposite direction of writing.

SUMMARY OF THE INVENTION

It is the object of the present invention to render code words of variable lengths more error-robust.

In accordance with a first aspect of the present invention, this object is achieved by an apparatus for producing a data stream, which comprises a multitude of raster points as reference points, the raster points specifying a raster, two adjacent raster points defining a segment, of code words of variable lengths which are divided up into a plurality of sets of code words, the apparatus comprising: a first device for writing at least a part of each code word of a first set of code words into the data stream in a first direction of writing, starting at a first raster point of a segment, respectively; a second device for writing at least a part of a code word of a second set of code words into the data stream in a second direction of writing, which is opposite to the first direction of writing, starting from a second raster point, respectively, the code words of the second set being assigned to segments in accordance with a predetermined assignment rule, such that each code word of the second set is assigned to a different segment, wherein, in case that a code word of the second set does not or not completely fit into the assigned segment, at least a part of this code word or at least a part of the remainder of this code word which does not fit into the assigned segment is written into a different, not fully occupied segment, in accordance with a predetermined rule, by the first device or the second device, after the second device for writing has processed all remaining segments with the other code words of the second set.

In accordance with a second aspect of the present invention, this object is achieved by an apparatus for reading a data stream which comprises a multitude of raster points as reference points, the raster points specifying a raster, two adjacent raster points defining a segment, wherein the data stream comprises a plurality of sets of code words, a first set of code words being written in the first direction and a second set of code words being written in a second direction, the code words of the second set being assigned to segments of the data stream in accordance with a predetermined assignment rule, such that each code word of a set being assigned to a different segment, wherein a code word of the second set may be divided up over more than one segment in accordance with a predetermined rule, the apparatus comprising the following: a first apparatus for reading in a first direction of reading which corresponds to the first direction of writing; a second device for reading in a second direction of reading which is opposite to the first direction of reading; and a control device for supplying the code words of the first set to the first reading device, each code word of the first set starting at the first raster point of a segment, and for supplying the code words of the second set to the second reading device, wherein one jumps to the second raster point of a segment in accordance with the predetermined assignment rule, and wherein, after all segments have been searched for code words of the second set and at least one code word of the second set is not present or not complete, one jumps at least to one further segment in accordance with the predetermined rule in order to obtain the at least one code word of the second set completely or a part of the at least one code word.

In accordance with a third aspect of the present invention, this object is achieved by a method for producing a data stream, which comprises a multitude of raster points (41-47) as reference points, the raster points specifying a raster, two adjacent raster points defining a segment, of code words of variable lengths, which are divided up into a plurality of sets of code words, the method comprising the following steps: writing at least a part of each code word of a first set of code words into the data stream in a first direction of writing, starting from a first raster point of a segment, respectively; writing at least a part of a code word of a second set of code words into the data stream in a second direction of writing which is opposite to the first direction of writing, starting from a second raster point of a segment, respectively, the code words of the second set being assigned to segments in accordance with the predetermined assignment rule, such that each code word of the second set is assigned to a different segment, wherein, in case a code word of the second set does not or not completely fit into the assigned segment, at least a part of this code word or at least a part of the remainder of this code word which does not fit into the assigned segment is written into a different, not fully occupied segment in the first or second direction of writing, in accordance with a predetermined regulation, after all remaining segments have been processed with the other code words of the second set.

In accordance with a fourth aspect of the present invention, this object is achieved by a method for reading a data stream which comprises a multitude of raster points as reference points, the raster points specifying a raster, two adjacent raster points defining a segment, in which method the data stream comprises a plurality of sets of code words, a first set of code words being written in the first direction and a second set of code words being written in a second direction, the code words of the second set being assigned to segments of the data stream in accordance with a predetermined assignment rule, such that each code word of a set is assigned to a different segment, wherein a code word of the second set may be divided up over more than one segment in accordance with a predetermined regulation, the method comprising the following steps: reading the code words of the first set, starting from a first raster point of a segment, in a first direction of reading which corresponds to the first direction of writing; reading the code words of the second set, starting from a second raster point of a segment, in a second direction of reading which is opposite to the first direction of reading wherein it is jumped, for reading the code words of the second set, to the second raster point of a segment in accordance with the predetermined assignment rule, wherein, after all segments have been searched for code words of the second set or at least a code word of the second set is not present or not completely present, one jumps to at least one further segment in accordance with the predetermined rule so as to obtain the at least one code word of the second set completely or a part of the at least one code word.

The present invention is based on the realization that the robustness of a data stream toward transmission errors and, in particular, toward sequence errors with code words of variable lengths can be decisively increased when the data stream is not written only in one direction of writing but is written, additionally, in the other direction of writing. In the most general case, a data stream will always have a start and an end. In the prior art, in the simplest case, the data stream was written onto, starting from the starting point, until it was completed. Thereby it was possible that a transmission error in the first code word could result in that the entire data stream could no longer be decoded correctly, even if all other code words were transmitted correctly. In accordance with the invention, such a data stream may be written such that the first half of the data stream is written starting from the start of the data stream, whereas the second half of the data stream is written starting from the end of the data stream. Even from this simple example, it can be seen that a transmission error in the first half of the data stream no longer has the effect that code words of the second data stream can also no longer be decoded correctly due to sequence errors. This is the case because the decoder knows that after half of the data stream it must continue reading starting from the end of the data stream, to be precise in the opposite direction of reading. Thus, a certain error robustness is obtained merely due to reversing the direction of writing/the direction of reading with virtually no extra effort.

As has already been mentioned, code words with variable lengths are written into a data stream using raster points such that a decoder can decode with a limited number of sequence errors since, by definition, certain code words start at raster points. For maximum error robustness, it will, in principle, be desirable to have a raster which is as narrow as possible, such that a decoder can find the correct starting points of as many code words as possible. On the other hand, an increase in the number of raster points, i.e. a reduction of the segment length, will result in that fewer and fewer code words which, as is known, have variable lengths, completely fit into the raster, which is why measures are taken for the end sections of the same to be written into other segments in order to be able to be detected correctly in decoding. This leads to an increasing additional effort with a raising number of raster points and with a reduction in the segment length.

In the prior art, code words were written merely in one single direction of writing, starting from a raster point, as has been explained with reference to FIGS. 5 and 6. In accordance with the invention, code words are now also written in the opposite direction of writing, starting from raster points, which causes the number of the code words which can be written starting at raster points to double, in the best case, essentially without any additional effort. By writing the data stream by means of a device for writing in a first direction of writing starting from a reference point and by means of a second device for writing in a second direction of writing which is opposite to the first direction of writing, starting from a different reference point, it becomes possible to not only utilize "one side" of a reference point, but both sides of a reference point for error robustness, i.e. for protection against propagation or sequence errors. Depending on the form of implementation, every other code word can be written in the same direction, for example, and every remaining code word can be written in the other direction. On the other hand, the code words of variable lengths can be divided up into different sets of code words, for example in accordance with their priority, such that, for example, all code words of the first set are written in the first direction of writing, starting at raster points, and all code words of the second set can be written in the second direction of writing, starting at raster points.

In addition, remainders of code words may be written in the same direction of writing as the starting sections of the code words or, alternatively, in the opposite direction of writing. It is evident that measures must be taken in order for a decoder, i.e. an apparatus for reading the data stream, to always be fully aware of which direction of writing has been used in writing. This may either be specifically set or be transmitted as side information to the data stream of code words of variable lengths. The same applies also to the segment lengths, wherein the segment length may either be equal or vary over the entire data stream, wherein the current segment length can of course also be specifically set in a decoder or can be transmitted via side information together with the code words of variable lengths.

BRIEF DESCRIPTION OF THE DRAWINGS

Preferred embodiments of the present invention will be explained in detail below with reference to the attached drawings, in which.

DETAILED DESCRIPTION OF PREFERRED EMBODIMENTS

Before FIG. 1 will be described in more detail, it should be noted that encoding with code words of variable lengths is also referred to as entropy encoding in the art. One representative example of entropy encoding is the so-called Huffman encoding. In principle, in Huffman encoding, the information symbols to be encoded are statistically examined in order to determine shorter code words for the information symbols occurring more frequently than for information symbols occurring less frequently. In a complete Huffman code, all code words are terminated ends or branches of a code tree. For example, a Huffman decoder serially reads in a data stream with Huffman code words and, put graphically, jumps to a branching of the specified code tree with each bit that it reads in additionally until, after a certain number of jumps, which corresponds to the number of bits of the code word, i.e. to the length of the code word, it arrives at a branch end which does not have any further branching and is therefore a code word. The decoder then knows that a new code word starts with the next bit. This process is repeated as often as required until the data stream has been completely read in. With each time that the Huffman encoder jumps back to the starting point, i.e. to the root of the tree, a code word is present at its point of origin. Since the lengths of the code words are implicitly specified by the code words themselves or by the code tree known in the encoder and in the decoder, it can be seen that an interference in the data stream which leads to a reversal of a bit misleads the decoder in the code tree, so to speak such that it ends up with a different code word, i.e. an incorrect code word, which is very likely to have a different length from the correct code word. In this case, the decoder will, once it has arrived at the incorrect code word, jump back and, due to the bits then following, again move from one branching point to another in the code tree. However, it is not possible for the decoder to avoid a sequence error, unless it coincidentally ends up on the "correct track".

Therefore, error protection, as is provided by the present invention, must be performed in order to ensure error-robust transmission. The apparatus for producing a data stream of code words of variable lengths in accordance with the present invention may therefore act as a sending or output stage of a Huffman encoder, as it were, whereas the apparatus for reading a data stream of code words of variable lengths may act as a receiving or input stage of a Huffman encoder. It can be seen from this that the present invention is not only applicable to Huffman encoders, but to any code having code words of variable lengths which is susceptible to sequence errors.

Figure 1:
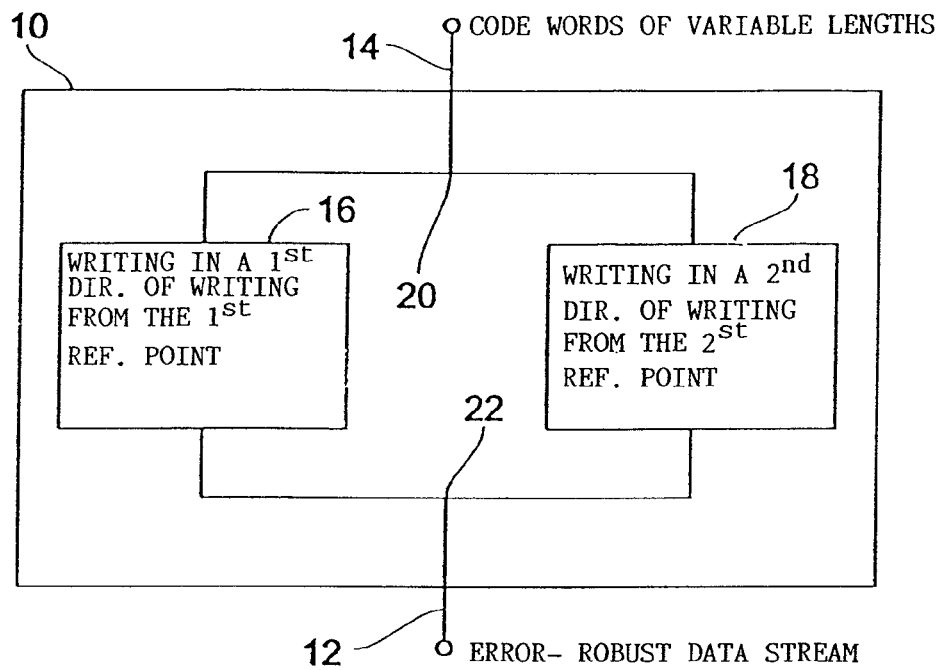
FIG. 1 shows an inventive apparatus for writing an error-robust data stream.

FIG. 1 shows an apparatus 10 in accordance with the invention for producing an error-robust data stream at an output 12, when code words of variable lengths are input into the apparatus 10 at an input 14. The apparatus includes a first device 16 for writing in a first direction of writing, starting from a first reference point, and a second device 18 for writing in a second direction of writing, starting from a second reference point. Depending on the complexity of the apparatus 10, the code words of variable lengths may both be applied to both devices 16 and 18 for writing, as is illustrated in FIG. 1 by a simple branching point 20 and a corresponding combination point 22. The selection as to which code words are written in which direction, and/or as to which sections of code words are written in which direction, would then be made by devices 16 and 18. Instead of the node 20, a demultiplexer may be present alternatively, which supplies certain code words, for example code words of a set of code words, to the first device 16, and supplies certain code words to the second device 18. By analogy therewith, the combination point 22 would then be implemented by a multiplexer multiplexing the error-robust data stream 12. Other devices, which would be controlled correspondingly, for supplying the two devices 16 and 18 with the code words of variable lengths are apparent for those skilled in the art in view of the present description.

Figure 2:
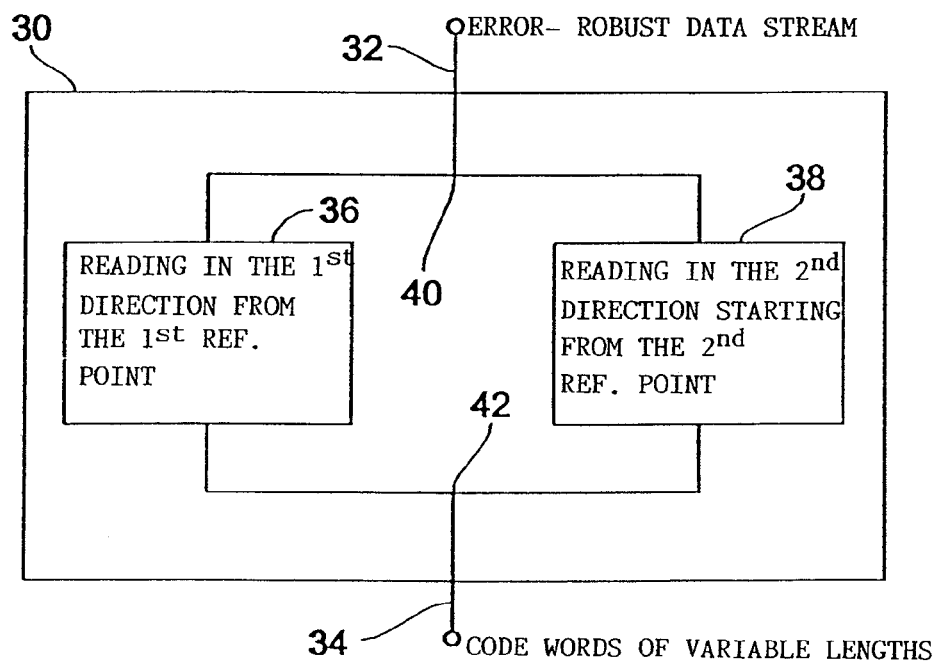
FIG. 2 shows an inventive apparatus for reading an error-robust data stream.

An apparatus 30 for reading an error-robust data stream, which apparatus is complementary to the apparatus 10 for producing a data stream, shown in FIG. 1, is shown in FIG. 2. Apparatus 30 includes an input 32, where the error-robust data stream is entered after transmission via a radio link for example, in order to obtain, again, at a starting point 34, the code words of variable lengths which have been fed into the input 14 of the apparatus 10 in FIG. 1. Apparatus 30 for reading the data stream includes a first device 36 for reading in the first direction, starting from the first reference point, and a second device 38 for reading the data stream in the second direction, starting from a second reference point.

It is evident that apparatus 30 also contains a branching point 40 and a combination point 42, the feeding-in of the error-robust data stream into the two devices 36 and 38 taking place, for example, based on a specifically set algorithm or based on side information which may also be transmitted, together with the error-robust data stream, from the sender, i.e. the apparatus 10 in FIG. 1, to the receiver, i.e. the apparatus 30 in FIG. 2.

Figure 3:
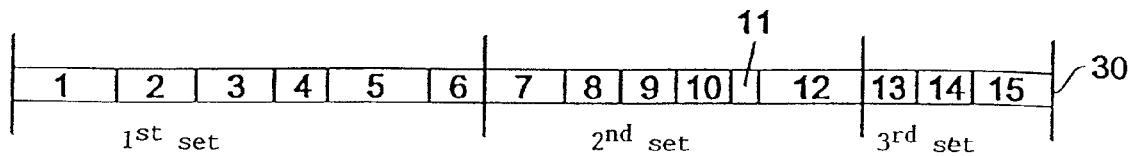
FIG. 3 shows a procedural diagram of the inventive method by means of three sets of code words of variable lengths.
Figure 3:
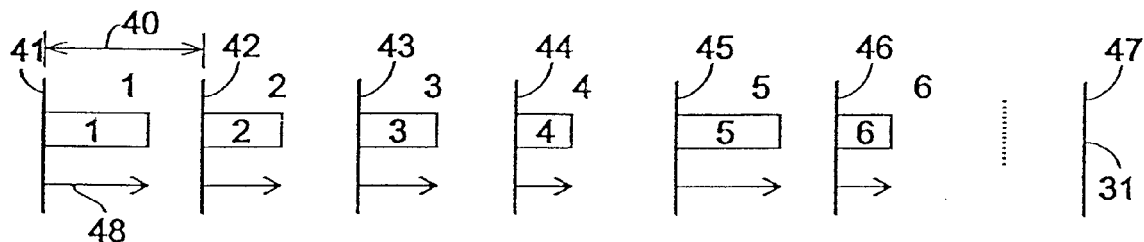
Figure 3:
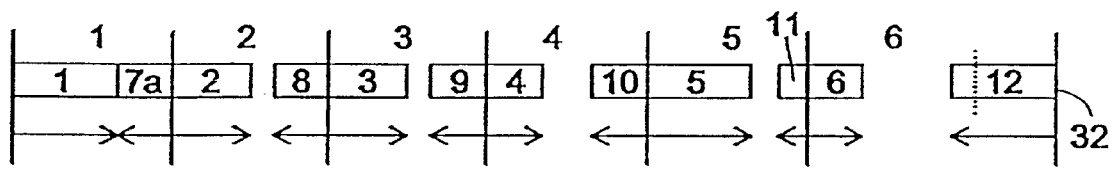
Figure 3:
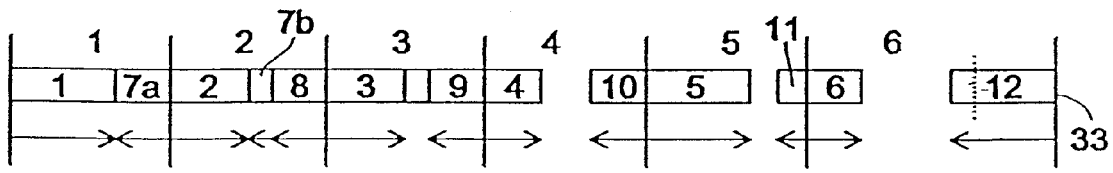
Figure 3:
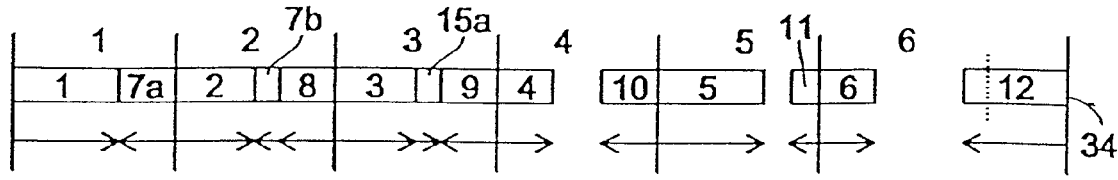
Figure 3:
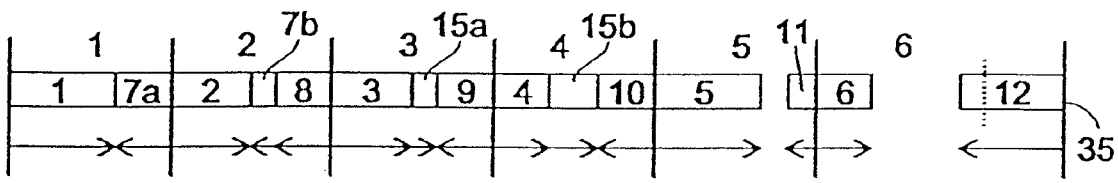
Figure 3:
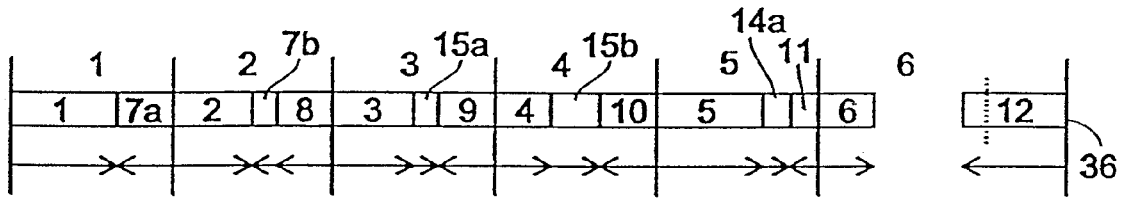
Figure 3:
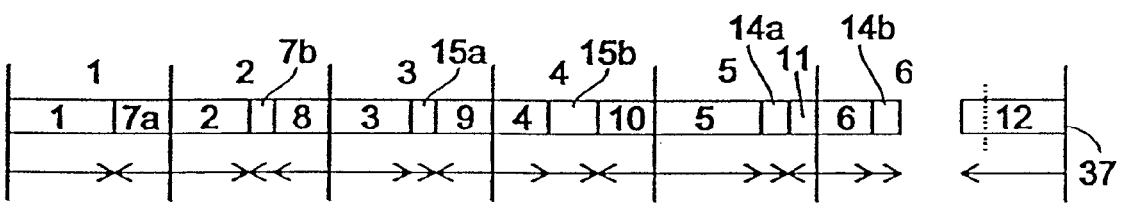
Figure 3:
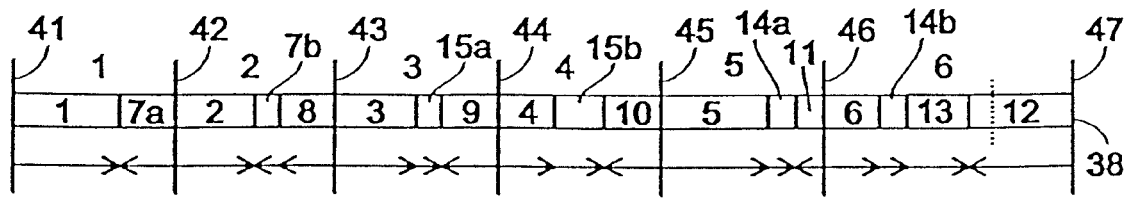

FIG. 3 illustrates, by means of an example, the inventive method for writing code words of variable lengths. In the example, there are 15 code words of variable lengths 30 which are preferably divided up into a first set having 6 code words 1 to 6, into a second set also having 6 code words 7 to 12 and into a third set having the remaining 3 code words 13 to 15. As is shown in FIG. 3, code words 30 have variable lengths.

In accordance with a preferred embodiment of the present invention, the segment length, i.e. the length of the segment, is longer than the length of the longest code word of the first set. The code words of the first set are arranged at raster points 41 to 46, wherein, for the last segment No. 6, a raster point is indicated by a dotted line, which raster point is not used, however, since the end 47 of the data stream can also be considered as a raster point as it were and since the raster point indicated by a dotted line is thus superfluous. The first segment No. 6 is therefore longer than the other segments, which is completely irrelevant for the present invention, however. Generally speaking, the segments may have any lengths, which change within the data stream, it being understood that the current length of a segment must be known to the decoder so that the inventive advantages can be utilized.

Firstly, the code words of the first set are written into the data stream in a step a), which results in a fragmentary data stream indicated by 31, in which the code words of the first set are written into a respective segment from left to right, as is indicated by arrows 48 which are to symbolize the direction of writing in the entire FIG. 3. Since the segment length is selected to be longer than the longest length of a code word of the first set, only one single attempt is needed for step a). In case the segments are shorter, more attempts may be required accordingly.

Now the code words of the second set are written into the data stream 31 in a step b). In order to achieve high error robustness, the code words of the second set are not written from left to right like the code words of the first set, but are written from right to left, starting from the second raster point, respectively, e.g. the raster point 42 for the first segment, as is indicated by the respective arrow of writing direction. The writing of the code words of the second set takes place in accordance with a predetermined assignment rule which says, in the example selected, that the first code word of the second set is to be written in the same segment as the first code word of the first set, however always on the condition that there is still room in this segment. The data stream 32 resulting from the first attempt shows that in the first segment there was only so much room for writing the starting section of code word No. 7.

In contrast to the prior art, where the second part of code word No. 7 would have been written into the second segment, the second half of code word No. 7, i.e. 7b), is stored for writing it into the data stream in a second attempt in accordance with a predetermined regulation, i.e. in accordance with an regulation which must also be known to the decoder. FIG. 3 clearly shows that in the second segment, there was still enough room between code word Nos. 2 and 8 for the final section of code word No. 7 to be entered. In case there had not been enough room, the third section of the code word would have been entered into segment No. 3. Thus, in FIG. 3, the predetermined regulation for entering code word No. 7 into the data stream consists in proceeding by one segment in each case. Of course, one may also proceed by two segments or by three or more, such that, as a consequence, the second segment 7b) could then be written, instead of the second segment, into the third, into the fifth in the next attempt, etc. The order of segments which is used to accommodate the second part of section 7 somewhere is arbitrary. However, it must be transparent to the decoder so that the re-sorted data stream can be re-read.

The code words of the third set 13 to 15 are now to be entered into the resulting data stream 33, which is also still fragmentary. By analogy with step b), this is done preferably by the same assignment rule such that the first code word of the third set is assigned to the first segment, that the second code word of the third set is assigned to the second segment, that the third code word of the third set is assigned to the third segment, etc. This assignment rule is entirely arbitrary for the third set and may also be different from the assignment rule for the second set, with each code word of a set being assigned to a different segment in accordance with the invention. Similarly, the direction of writing can also be selected arbitrarily for each set. Preferably, an alternating writing direction order is used. Alternatively, however, it is also possible to write two adjacent sets using the same direction of writing. In principle, the writing direction may also altered within a set.

The first attempt in step c) was successful only in that the first section of code word No. 15 was entered, resulting in a fragmentary data stream 34. Code words 13, 14 and the second section of code word 15, i.e. 15b) are stored for being accommodated in the second, third, fourth, fifth and sixth attempts, wherein the second section 15b could be accommodated in the fourth segment in the second attempt (data stream 35), wherein nothing could be accommodated in the third attempt, wherein the starting section of code word 14 could be accommodated in the fourth attempt (data stream 36), wherein the final section of code word 14, i.e. 14b could be accommodated in the fifth attempt (data stream 37) and wherein, finally, the first code word of the third set could be entered in the sixth segment in the sixth and final attempt, which results in the error-robust data stream 38 for the example illustrated here. The method described using FIG. 3 ensures that the length of the error-robust data stream exactly corresponds to the sum of the lengths of the code words of variable lengths, which is self-evident for the purposes of entropy encoding for data reduction. However, the present invention is not limited to the error-robust data stream having the minimal length, since error robustness is not affected by any filler bits that may be present.

When looking at the robust data stream shown in FIG. 3, it can be seen that the start of code word No. 8, i.e. raster point 43, is entirely independent of the end of code word No. 7. Moreover, the start of code word No. 9, i.e. raster point 44, is entirely independent of the end of code word No. 8. Additionally, it should be noted that due to the opposite writing order, a data error in code word No. 1 in the first segment, for example, which leads to the fact that the incorrect code word is one bit shorter than the correct code word No. 1 due to the data error, does not lead to a destruction of the starting section of code word No. 7a, since the latter was written from right to left instead of from left to right. In case it had been written from left to right, a decoder would take the remaining bit from the initially correct code word No. 1 as the starting bit of code word No. 7, which would result in a sequence error from 1 to 7. However, this sequence error would not propagate to 8, since code word No. 8, again, is entirely independent of code word No. 7, since the writing order was chosen to be from right to left. In case the writing order of code word No. 8 is equal to the writing order of the code words of the first set, the error would not propagate from 7 to 8 either, since code word No. 8 would be written adjacent to code word No. 2 before the second part 7b due to the assignment rule and is, therefore, not influenced by an incorrect section 7b.

Figure 4:
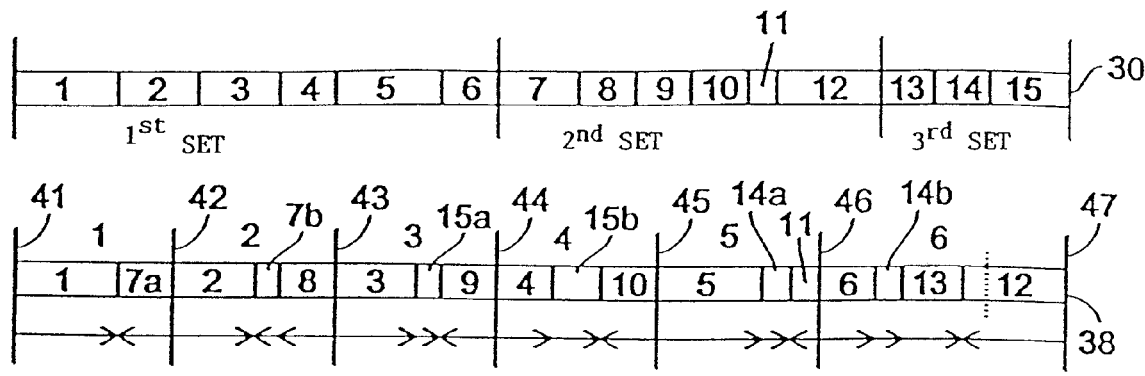
FIG. 4 shows a procedural diagram for illustrating the inventive method for reading a data stream which has been produced in accordance with FIG. 3.
Figure 4:
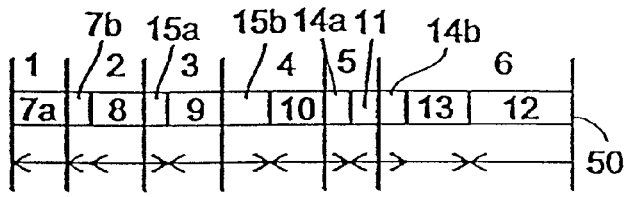
Figure 4:
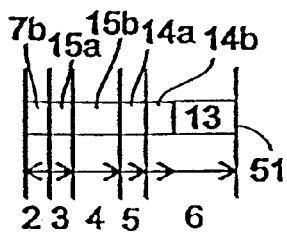
Figure 4:
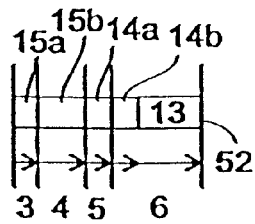
Figure 4:
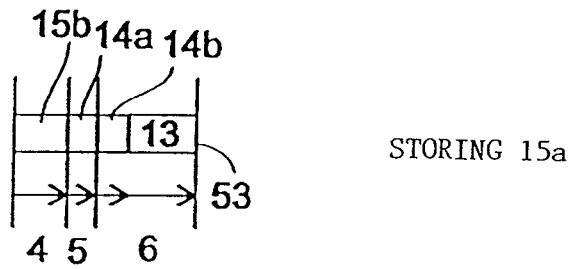
Figure 4:
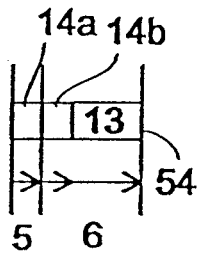
Figure 4:
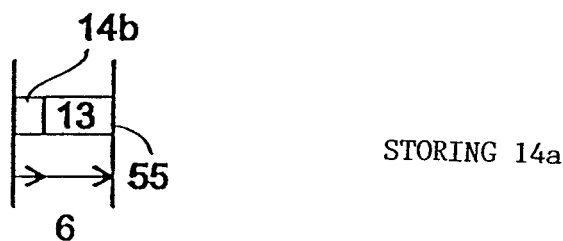
Figure 4:
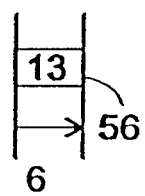
Figure 5:
FIG. 5 shows a data stream which is produced by a known apparatus and in which the priority code words are exposed to error propagation.
Figure 5:
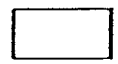
Figure 5:
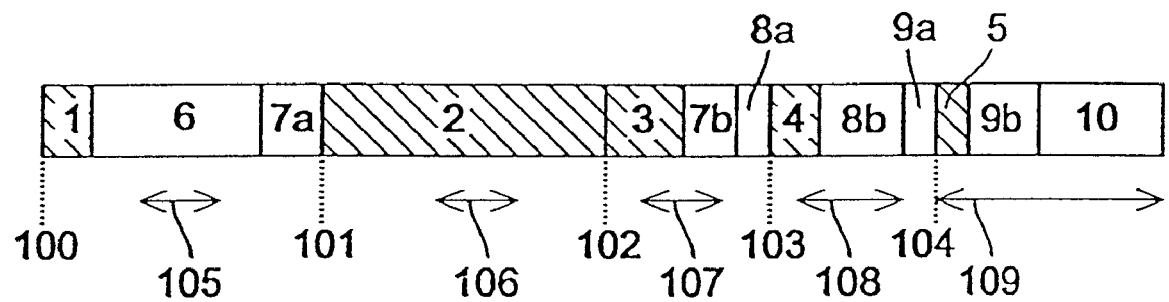
Figure 6:
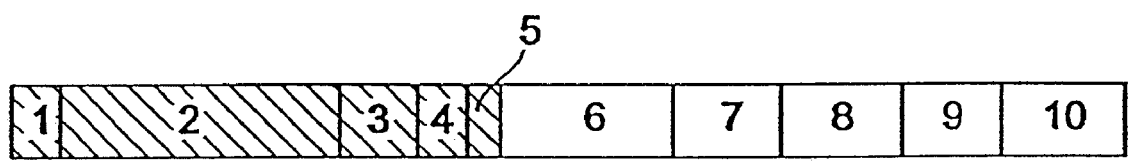
FIG. 6 shows a data stream in which sorting by priority code words and non-priority code words has been carried out.

By means of an appropriate example, FIG. 4 shows the operation of the apparatus for reading the error-robust data stream 38. Initially, the code words of the first set are extracted from the error-robust data stream in step a). For this purpose, the inventive apparatus, which may be coupled to a Huffman decoder, reads the code word of the first set starting from the first raster point 41, reads code word No. 2 of the first set starting from the second raster point 42, etc., until all code words 1 to 6 of the first set have been read in. It is self-evident that the apparatus for reading the data stream selects the same direction as has been used by the apparatus for producing.

Subsequently, the code words of the second set are extracted from the remaining data stream 50 in step b). Here, the decoder jumps to the second raster point 42 of the first segment and obtains the starting section of code word 7 of the second set (the first segment is now empty), whereupon it does not read in the second section 7b, but 7a is first stored in order to then read in the second code word of the second set starting from the second raster point of the second segment, etc. The result is a residual data stream 51 in which the first segment has been completely emptied. Since the decoder does not now read the code word 7 continuously, but always reads segment by segment on the basis of the assignment rule used for the apparatus for producing the data stream, the error robustness which has already been described and which strongly reduces propagation of sequence errors is ensured.

In a second attempt for extracting the code words of the second set, the second part of code word 7b is now read in the second segment in accordance with the existing writing direction, whereupon only code words of the third set remain in the resulting data stream 52, and the second segment is empty. These are extracted in step c), wherein the starting section of code word 15 has been initially determined in a first attempt, which is not stored however, since code word 15 has not been found complete in the third segment. The third segment is now empty. In a second attempt, code word 15 can be found complete. However, the search for code word 14 in segment 3 and for code word 15 in segment 14 remained without success, which can be seen by the data stream 54. Nevertheless, in the fourth attempt, the search for code word 14 in the fifth segment lead to a positive result. However, code word 14 was not complete, which is why the starting section 14a was stored in order to examine the remaining data stream 55 in a fifth attempt and to fully read in, in a final sixth attempt, data stream 56, which now only consists of the sixth segment and of code word 13.

Even though in the previous example merely a division of code words into a starting section and a final section was illustrated by way of example, any type of division is possible in principle. Error-robust decoding will be ensured as long as the decoder observes the assignment of code words of the second set or of the third set and of further sets to different segments, respectively. Moreover, it is obvious that the sorting of the final sections of code words into the data stream is arbitrary as long as the decoder or the read-in circuit upstream of the decoder knows exactly which predetermined regulation has been carried out in the encoder.

In order to once again underline the advantages and/or the operation of the present invention, reference is made to the error-robust data stream No. 38 of FIG. 3. When looking at the first segment between the raster points 41 and 42, it can be seen that code word No. 1 is written from left to right, starting from the first raster point 41, as is clearly indicated by the arrow drawn underneath. The first part of code word No. 7, i.e. 7a, however, is written from right to left, starting from the second raster point 42. If both code words No. 1 and No. 7 or 7a were written into the data stream only from left to right, the start of code word 7 or the starting point of the starting section 7a of code word 7 would depend on the end of code word 1. Therefore, a transmission error in code word 1 would almost inevitably also lead to a sequence error in code word 7. However, if code word 7 is written in the opposite direction of writing, starting from the second raster point 42, in accordance with the invention, the starting point of code word 7 or of starting section 7a of code word 7 no longer depends on code word 1 but is determined by the raster or raster point 42. A decoder will always know this starting point, which is why an error in code word 1 will not lead to an error in code word 7. It can be seen from the error-robust data stream 38 of FIG. 3 that the first section 7a and the second section 7b of code word No. 7 are both written in the same direction of writing. However, this is not compulsory. Of course, the second section 7b of code word 7 may also be written from left to right and would then start at the end of the second code word No. 2.

If the raster points are chosen such that the segment lengths are longer than the longest length of a code word of the first set, no segment will be filled in completely by the code word of the first set, as can be seen, for example, from the data stream 31 of FIG. 3. In this case, the number of code words which can be written starting at raster points is actually doubled without there being any need of providing one single additional raster point.

The invention claimed is:

1. Apparatus for reading a data stream, which comprises a multitude of raster points as reference points, the raster points specifying a raster, two adjacent raster points defining a segment, wherein the data stream comprises a plurality of sets of code words, a first set of code words being written in the first direction and a second set of code words being written in a second direction, the code words of the second set being assigned to segments of the data stream in accordance with a predetermined assignment rule, such that each code word of a set being assigned to a different segment, wherein a code word of the second set is distributed over more than one segment in accordance with a predetermined rule, the apparatus comprising:
- a first device for reading in a first direction of reading which corresponds to the first direction of writing;
- a second device for reading in a second direction of reading which is opposite to the first direction of reading; and
- a control device
  - for supplying the code words of the first set to the first reading device, each code word of the first set starting at the first raster point of a segment, and
  - for supplying the code words of the second set to the second reading device, wherein one jumps to the second raster point of a segment in accordance with the predetermined assignment rule, and
- wherein the control device is adapted for jumping at least to a further segment different from the segment, in which the part of the code word of the second set has been found, in accordance with the predetermined rule, when all segments have been searched for code words of the second set in accordance with the predetermined assignment rule and only a part of the code word of the second set has been found in a segment and the code word of the second set is still not complete, and
- wherein the control device is adapted for obtaining the at least one code word of the second set completely or a further part of the at least one code word of the second set from the further segment,
- wherein the code words output by the first device for reading and output by the second device for reading represent information symbols and wherein code words of the first set represent more significant information symbols than code words of the second set or of further sets, and
- wherein the information symbols are spectral values of an audio signal, and wherein the code words of the first set are spectral values which are more significant from a psycho-acoustic point of view compared to the code words of the second set.

2. Apparatus as claimed in claim 1, wherein, if only one starting section of a code word is read by a writing device in one segment, this starting section is stored.

3. Apparatus as claimed in claim 1, wherein the code words are Huffman code words.

4. Apparatus as claimed in claim 1, wherein the code words of the first set are protected against error propagation due to a transmission error in the data stream.

5. Method for reading a data stream which comprises a multitude of raster points as reference points, the raster points specifying a raster, two adjacent raster points defining a segment, in which method the data stream comprises a plurality of sets of code words, a first set of code words being written in the first direction and a second set of code words being written in a second direction, the code words of the second set being assigned to segments of the data stream in accordance with a predetermined assignment rule, such that each code word of a set is assigned to a different segment, wherein a code word of the second set is distributed over more than one segment in accordance with a predetermined regulation, the method comprising:
- reading the code words of the first set, starting from a first raster point of a segment, in a first direction of reading which corresponds to the first direction of writing;
- reading the code words of the second set, starting from a second raster point of a segment, in a second direction of reading which is opposite to the first direction of reading, wherein it is jumped, for reading the code words of the second set, to the second raster point of a segment in accordance with the predetermined assignment rule, and
- when all segments have been searched for code words of the second set in accordance with the predetermined assignment rule and only a part of the code word of the second set has been found in a segment and the code word of the second set is still not complete, jumping to at least one further segment different from the segment, in which the part of the code word of the second set has been found, in accordance with the predetermined rule, and obtaining the at least one code word of the second set completely or a part of the at least one code word from the further segment,
- wherein the code words output by the steps of reading represent information symbols and wherein code words of the first set represent more significant information symbols than code words of the second set or of further sets, and
- wherein the information symbols are spectral values of an audio signal, and wherein the code words of the first set are spectral values which are more significant from a psycho-acoustic point of view compared to the code words of the second set.

* * * * *

UNITED STATES PATENT AND TRADEMARK OFFICE
CERTIFICATE OF CORRECTION

PATENT NO. : 7,526,432 B2  Page 1 of 1
APPLICATION NO. : 12/018136
DATED : April 28, 2009
INVENTOR(S) : Ralph Sperschneider et al.

It is certified that error appears in the above-identified patent and that said Letters Patent is hereby corrected as shown below:

Title page, ADD TEXT item:
[62] Division of application No. 09/913,708, filed Sep. 24, 2001, now Pat. No. 7,433,825, which is a 371 of PCT/EP00/00314, filed on Jan. 17, 2000.

Title page, ADD item:
[30] Foreign Application Priority Data
Feb. 23, 1999 (DE) ..........................................19907728.2

Signed and Sealed this

Fifteenth Day of June, 2010

David J. Kappos
*Director of the United States Patent and Trademark Office*